United States Patent [19]
Füllmann et al.

[11] 4,217,504
[45] Aug. 12, 1980

[54] SEMICONDUCTOR SWITCH WITH THYRISTORS

[75] Inventors: Marius Füllmann, Neu-Isenburg; Friedhelm Sawitzki, Frankfurt am Main; Dieter Silber, Hausen, all of Fed. Rep. of Germany

[73] Assignee: Licentia-Patent Verwaltungs GmbH, Frankfurt am Main, Fed. Rep. of Germany

[21] Appl. No.: 885,072

[22] Filed: Mar. 9, 1978

Related U.S. Application Data

[63] Continuation of Ser. No. 711,689, Aug. 4, 1976, abandoned.

[30] Foreign Application Priority Data

Aug. 4, 1975 [DE] Fed. Rep. of Germany ....... 2534704

[51] Int. Cl.$^2$ ............................................. H03K 17/72
[52] U.S. Cl. ................................ 307/252 C; 307/305; 357/38
[58] Field of Search ............... 307/252 C, 252 A, 305; 357/38

[56] References Cited

U.S. PATENT DOCUMENTS

| | | | |
|---|---|---|---|
| 3,590,346 | 6/1971 | Bilo et al. | 307/305 X |
| 3,794,890 | 2/1974 | Weimann et al. | 357/38 |
| 4,083,063 | 4/1978 | Yu | 357/38 |

OTHER PUBLICATIONS

IEEE Conference Record Of IAS, 1973 Eighth Annual Meeting, E. Wolley et al., "Characteristics of a 200 AMP Gate Turn-Off Thyristor," pp. 251-255, Oct. 11, 1973.

*Primary Examiner*—John Zazworsky
*Attorney, Agent, or Firm*—Spencer & Kaye

[57] ABSTRACT

A semiconductor switch including a main thyristor and an auxiliary thyristor which can both be switched on and off by a control current. The anodes of the two thyristors are connected together and lead to a first load current terminal for the switch, the cathode of the main thyristor leads to a second load current terminal for the switch, the control electrode of the main thyristor is connected with the cathode of the auxiliary thyristor, and the control current for the switch is fed in via the control electrode of the auxiliary thyristor. The turn-off gain of the main thyristor is greater than the turn-off gain of the auxiliary thyristor and the holding current of the auxiliary thyristor is lower than the holding current of the main thyristor.

8 Claims, 2 Drawing Figures

SEMICONDUCTOR SWITCH WITH THYRISTORS

CROSS REFERENCE TO RELATED APPLICATION

This application is a continuation of copending United States patent application Ser. No. 711,689, filed Aug. 4, 1976, now abandoned.

BACKGROUND OF THE INVENTION

The present invention relates to a semiconductor switch utilizing thyristors of the type including an anode, a cathode and a gate or control electrode. A thyristor is a semiconductor switch which permits the switching on of a load current by means of a relatively low control current. In normal thyristors, switching off of the thyristor is effected in that the load current is lowered to below a minimum value, the so-called holding current. However, so-called gate turn-off thyristors are known in which switching off, as well as switching on, are effected via the control current, the control current being directed in the opposite direction for switching off than for switching on of the thyristor. The switch-off behavior of a thyristor is characterized by the turn-off gain which is defined as the ratio of the anode current to the required negative control current. In the presently known embodiments of gate turn-off thyristors, however, a relatively large control current which typically is 10 to 30% of the load current carried by the thyristor in the switched-on state, is required for switching off of the thyristor. Additionally, the transmission losses of gate turn-off thyristors are substantially higher than those of normal thyristors. In particular, a considerable forward voltage drop must be tolerated at very high switch-off amplification. Moreover, in such thyristors the holding current becomes very high. Such devices are described, for example, in the U.S. Pat. No. 3,210,563 issued Oct. 5, 1965 to T. C. T. New and in the Canadian Patent No. 774.273 issued in Dec. 1967 to Moyson et. al.

SUMMARY OF THE INVENTION

It is therefore the object of the present invention to provide a semiconductor switch utilizing thyristors which can be switched on and off by a control current and which has good switching properties and a low holding current. In particular, improved on-state behavior is simultaneously provided.

The above object is achieved according to the present invention in that the switch comprises a main thyristor and an auxiliary thyristor each having anode, cathode and control electrodes, which can both be turned on and off by a control current and with the turn-off gain of the main thyristor being greater than the turn-off gain of the auxiliary thyristor and the holding current of the auxiliary thyristor being lower than the holding current of the main thyristor. The anodes of the two thyristors are connected together and lead to a first load current terminal of the switch, the cathode of the main thyristor leads to a second load current terminal of the switch, the control electrode of the main thyristor is connected with the cathode of the auxiliary thyristor and the control current for the switch is fed in via the control electrode of the auxiliary thyristor.

In the semiconductor switch according to the present invention a high turn-off gain is realized with simultaneously low holding current so that even with low load currents good stability of the switch is assured.

As indicated above, in the semiconductor switch according to the present invention the control current is fed to the control electrode of the auxiliary thyristor while the load current of the auxiliary thyristor is fed as a control current into the control electrode of the main thyristor. For switch-off, the auxiliary thyristor receives a negative control current which is transferred, no later than after the auxiliary thyristor has been switched off, via the gate-cathode path of the latter, to the main thyristor and switches it off.

In a preferred embodiment of the invention the semiconductor switch is operated so that the auxiliary thyristor constantly feeds a control current to the main thyristor in the switched-on state in order to reduce the forward voltage drop of the main thyristor. In this case the main thyristor is designed so that its forward voltage drop can be reduced by feeding in a control current.

Preferably, in the preferred embodiment of the invention the turn-off gain of the main thyristor is greater than 5 and the holding current of the auxiliary thyristor is less than the holding current of the main thyristor by at least the factor 2.

The above dimensioning of the semiconductor switch according to the invention can be realized in a simple manner by a selection of commercially available thyristors or thyristors produced in a known manner.

DESCRIPTION OF THE PREFERRED EMBODIMENTS

Figure 1:
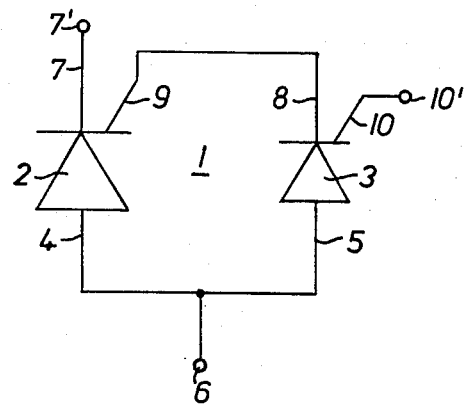
FIG. 1 is a basic circuit diagram of a semiconductor switch according to the invention.

Referring now to FIG. 1, the semiconductor switch 1 according to the invention includes a main thyristor 2 and an auxiliary thyristor 3. The anode terminals 4 and 5 of the thyristors 2 and 3 respectively are connected together and lead to a first load current terminal 6 for the switch 1. The cathode electrode of the main thyristor 2 simultaneously serves as the second load current terminal 7' of the switch. The cathode electrode 8 of the auxiliary thyristor 3 is connected with the control electrode 9 of the main thyristor. The control current is fed to the semiconductor switch 1 via a terminal 10' which simultaneously is the control electrode 10 of the auxiliary thyristor 3.

As indicated above both thyristors 2 and 3 are of the type which can be switched on and off by a control current, and the thyristors 2 and 3 are selected such that the turn-off gain of the main thyristor 2 is greater than the turn-off gain of the auxiliary thyristor 3 and the holding current of the auxiliary thyristor 3 is lower than the holding current of the main thyristor 2. Preferably the turn-off gain of the main thyristor 2 is at least 5, and the holding current of the auxiliary thyristor 3 is less than that of the main thyristor 2 by at least a factor of 2.

In operation, if the auxiliary thyristor 3 has been fired by means of a control current fed in via control electrode 10, its cathode current is fed as a control current to the control electrode 9 of the main thyristor 2, whereupon the main thyristor 2 is also brought into the conductive state. The normally relatively high forward voltage drop across the main thyristor 2 is significantly reduced in that the auxiliary thyristor 3 remains fired and feeds a control current to the main thyristor 2 during the entire switch-on phase.

Figure 2:
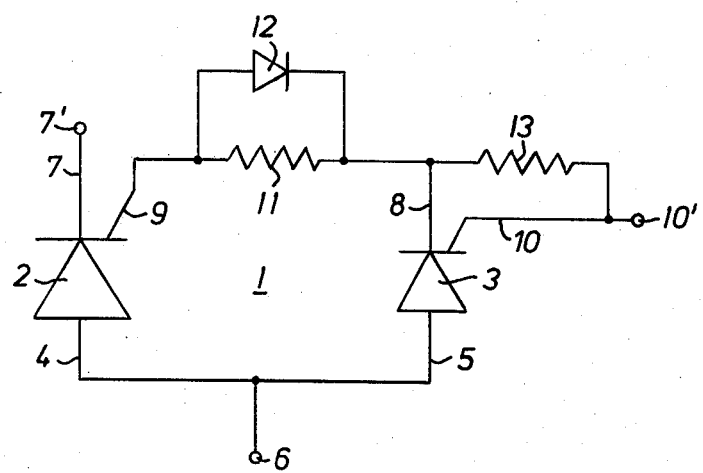
FIG. 2 shows a modified embodiment of the semiconductor switch of FIG. 1.

By introducing additional circuit components the switching properties of the semiconductor switch 1 according to the invention can be further improved. As shown in FIG. 2 a resistor 11 may be disposed in the circuit path between the cathode electrode 8 of the auxiliary thyristor 3 and the control electrode 9 of the main thyristor 2. With this resistor 11 the load current distribution of the switch is made more favorable. As further shown in FIG. 2, preferably a diode 12 is disposed in parallel with resistor 11 and is polarized so that the switch-off current of the control electrode 9 of the main thyristor 2 can be fed thereto at full amplitude, i.e., in the illustrated embodiment the anode of diode 12 is connected to the control electrode 9. Finally, as further shown in FIG. 2, a resistor 13 may be provided between the cathode 8 and the control electrode 10 of the auxiliary thyristor 3. This resistor 13 improves the flow of the switch-off current and stablizes the entire arrangement against undesirable faulty firing. If necessary, this resistor 13 can also constitute an overload protection during switch-off for the auxiliary thyristor.

The switch 1 including the two thyristors 2 and 3 of FIGS. 1 and 2 and the resistors and diode 11–13 of FIG. 2 may be provided by individual discrete components or by integrated circuit techniques. Preferably, however, the switch 1 is provided by hybrid circuit techniques. For example, the two thyristors 2 and 3 may be formed monolythically as disclosed in applicants' concurrently filed United States Patent Application entitled *Gate Turn-Off Thyristor*, Ser. No. 711,690 the disclosure of which is entirely incorporated herein, and the resistors 11 and 13 and the diode 12 provided as discrete components.

In this example, the thyristors 2 and 3 are gate turn-off devices with the following data:

|  | thyristor 2 | thyristor 3 | total switch acc. to FIG. 1 |
|---|---|---|---|
| turn-off gain | 17 | 9 | 17 |
| (at load current) | (4 A) | (1 A) | (4 A) |
| forward voltage drop (at 300° K., load current as above) | 9.5 V | 2 V | 4 V |
| holding current | 0.16 A | 0.03 A | 0.04 A |
| blocking voltage of the junction between cathode emitter and control base (electrodes 7 and 9 electrodes 8 and 10 resp.) | 18 V | 14 V |  |

The turn-off gain was determined under the following conditions: Source voltage 100 V, device temperature 300° K., total turn-off time 10 μs. The gate voltage for turn-off had to be ≧25 V when the switch was used in the simple form shown in FIG. 1; it was reduced to ≦15 V in a switch according to FIG. 2. The resistors 13 and 11 has resistance of 40 Ω and 5 Ω respectively.

The thyristor switch need not necessarily be made in the special embodiment with both thyristors monolythically integrated, but can also be made with separate devices 2 and 3. If the device data are chosen similar to those of the devices used in the integrated example, similar results concerning the switch properties are obtained.

It will be understood that the above description of the present invention is susceptible to various modifications, changes and adaptions, and the same are intended to be comprehended within the meaning and range of equivalents of the appended claims.

What is claimed is:

1. In a semiconductor switch comprising a main thyristor having an anode, a cathode and a control electrode and an auxiliary thyristor having an anode, a cathode and a control electrode, with both of said thyristors being of the type which can be switched on and off by a control current fed to the control electrode of same, and with said anode of said main thyristor being connected to said anode of said auxiliary thyristor and to a first load current terminal for said switch, said cathode of said main thyristor being connected to a second load current terminal for said switch, said control electrode of said main thyristor being connected with said cathode of said auxiliary thyristor, and said control electrode of said auxiliary thyristor being connected to an input terminal for a control current for said semiconductor switch to turn same on and off; the improvement wherein said auxiliary thyristor has a turn-off gain and a holding current which are sufficiently less than the turn-off gain and the holding current respectively of said main thyristor so that said auxiliary thyristor will remain conducting during the current conducting switched-on state of said main thyristor and continuously feed a control current to said control electrode of said main thyristor to reduce the forward voltage drop of said main thyristor, whereby the on-state behavior of said semiconductor switch is improved and the holding current of said semiconductor switch is reduced.

2. A semiconductor switch as defined in claim 1 wherein said turn-off gain of said main thyristor is greater than 5.

3. A semiconductor switch as defined in claim 2 wherein said holding current of said auxiliary thyristor is less than said holding current of said main thyristor at least by the factor 2.

4. A semiconductor switch as defined in claim 1 wherein said holding current of said auxiliary thyristor is less than said holding current of said main thyristor at least by the factor 2.

5. A semiconductor switch as defined in claim 1 further comprising an ohmic resistor connected between said control electrode of said main thyristor and said cathode of said auxiliary thyristor.

6. A semiconductor switch as defined in claim 5 further comprising a diode connected in parallel with said ohmic resistor with the anode of said diode being connected to said control electrode of said main thyristor.

7. A semiconductor switch as defined in claim 6 further comprising a further ohmic resistor connected between said cathode and said control electrode of said auxiliary thyristor.

8. A semiconductor switch as defined in claim 1 further comprising an ohmic resistor connected between said cathode and said control electrode of said auxiliary thyristor.

* * * * *